United States Patent
Fu et al.

(10) Patent No.: US 9,048,389 B2
(45) Date of Patent: Jun. 2, 2015

(54) LIGHT EMITTING DIODE

(71) Applicant: Industrial Technology Research Institute, Hsinchu (TW)

(72) Inventors: Yi-Keng Fu, Hsinchu County (TW); Chih-Wei Hu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 25 days.

(21) Appl. No.: 14/033,527

(22) Filed: Sep. 23, 2013

(65) Prior Publication Data

US 2015/0083990 A1    Mar. 26, 2015

(51) Int. Cl.
*H01L 33/06* (2010.01)
*H01L 33/32* (2010.01)

(52) U.S. Cl.
CPC .............. *H01L 33/325* (2013.01); *H01L 33/06* (2013.01)

(58) Field of Classification Search
CPC ............. H01L 33/0062–33/0079; H01L 33/06
USPC .............................................. 257/13; 438/47
See application file for complete search history.

(56) References Cited

U.S. PATENT DOCUMENTS

| | | | |
|---|---|---|---|
| 7,176,480 B2 | 2/2007 | Ohtsuka et al. | |
| 7,601,621 B2 | 10/2009 | Choi et al. | |
| 7,608,532 B2 | 10/2009 | Lin et al. | |
| 7,754,514 B2 | 7/2010 | Yajima et al. | |
| 8,048,702 B2 | 11/2011 | Enya et al. | |
| 8,120,013 B2 | 2/2012 | Takano et al. | |
| 8,415,654 B2 | 4/2013 | Khan et al. | |
| 8,604,488 B2 * | 12/2013 | Fu et al. | ........................ 257/76 |
| 2007/0246736 A1 | 10/2007 | Senda et al. | |
| 2009/0152586 A1 | 6/2009 | Lee et al. | |
| 2010/0123119 A1 | 5/2010 | Kim et al. | |
| 2013/0112987 A1 * | 5/2013 | Fu et al. | ........................ 257/76 |

FOREIGN PATENT DOCUMENTS

| | | |
|---|---|---|
| CN | 1747185 | 3/2006 |
| JP | 10041581 | 2/1998 |

(Continued)

OTHER PUBLICATIONS

Fu et al., "Study of InGaN-Based Light-Emitting Diodes on a Roughened Backside GaN Substrate by a Chemical Wet-Etching Process," IEEE Photonics Technology Letters, vol. 23, No. 19, Oct. 1, 2011, pp. 1373-1375.

(Continued)

*Primary Examiner* — Daniel Shook
(74) *Attorney, Agent, or Firm* — Jianq Chyun IP Office

(57) ABSTRACT

A light emitting diode including a substrate, a p-type and n-type semiconductor layers, an active layer, a first and second electrodes is provided. The active layer is located between the n-type and p-type semiconductor layers, and includes i quantum wells and (i+1) quantum barrier layers, each quantum well is located between any two of the quantum barrier layers, each of k quantum wells among the i quantum wells is constituted of a light emitting layer and an auxiliary layer, in which an indium concentration of the auxiliary layer is greater than an indium concentration of the light emitting layer, where i and k are natural numbers greater than or equal to 1 and k≤i. The first electrode and second electrodes are located on the n-type semiconductor layer and the p-type semiconductor layer, respectively.

15 Claims, 11 Drawing Sheets

(56) References Cited

FOREIGN PATENT DOCUMENTS

| KR | 1238241 | 3/2013 |
|---|---|---|
| TW | I338382 | 3/2011 |

OTHER PUBLICATIONS

Liu et al., "Effects of TMIn flow on the interface and optical properties of InGaN/GaN mutiple quantum wells," Journal of Crystal Growth, vol. 264, Issues 1-3, Mar. 15, 2004, pp. 53-57.

Fu et al., "Optical Simulation and Fabrication of Near-Ultraviolet LEDs on a Roughened Backside GaN Substrate," IEEE Photonics Technology Letters, vol. 24, No. 6, Mar. 15, 2012, pp. 488-490.

Hsueh et al., "Improvement of the Efficiency of InGaN—GaN Quantum-Well Light-Emitting Diodes Grown With a Pulsed-Trimethylindium Flow Process," IEEE Photonics Technology Letters, vol. 21, No. 7, Apr. 1, 2009, pp. 414-416.

Zhang et al., "InGaN self-assembled quantum dots grown by metalorganic chemical-vapor deposition with indium as the antisurfactant," Applied Physics Letters, vol. 80, No. 3, Jan. 21, 2002, pp. 485-487.

Kwon et al., "Si delta doping in a GaN barrier layer of InGaN/GaN multiquantum well for an efficient ultraviolet light-emitting diode," Journal of Applied Physics, vol. 97, May 12, 2005, pp. 1-4.

\* cited by examiner

QB=925°C

~4x10⁸ cm⁻²

QB=840°C

~2x10⁸ cm⁻²

LIGHT EMITTING DIODE

TECHNICAL FIELD

The disclosure relates to a light emitting diode (LED), and an LED capable of enhancing luminous intensity.

BACKGROUND

A light emitting diode (LED) is a semiconductor device constituted mainly by group III-V compound semiconductor materials, for instance. Such semiconductor materials have a characteristic of converting electricity into light. Hence, when a current is applied to the semiconductor materials, electrons therein would be combined with holes and release excessive energy in a form of light, thereby achieving an effect of luminosity.

Generally speaking, since the lattice mismatch between gallium nitride (GaN) and sapphire substrate is approximately 16%, a large quantity of defects are generated at the lattice interface, and thus causing a drastic decay in the light emitting intensity. The amount of defects is unavoidable during the growth process of LED. However, when the emitted wavelength of light from the LED is 450 nm, it is known that lattice stress is released around the defects and forms self-assembled indium-riched regions. Therefore, when carriers move to the defects, the carriers are likely to capture by the self-assembled indium-riched regions, thus forming the so-called localized effect. Since the quantum confinement effect of the self-assembled indium-riched regions is capable of increasing the carrier recombination rate, therefore, even though the GaN LED is limited by the high defect density, a certain degree of luminous intensity is still maintained at the 450 nm wavelength of light.

When the luminous wavelength of the LED gradually shifts from blue to the ultraviolet wavelengths of light, due to the concentration of indium decreasing gradually in the active layer, the self-assembled indium-riched regions are also correspondingly lessened. Consequently, the carriers in the LED are likely to move to the defect areas and generate non-radiative recombination, thereby drastically decreasing the luminous intensity of the LED at the ultraviolet wavelengths. As a result, manufacturers in the pertinent art endeavour to develop LED with satisfactory luminous efficiency.

SUMMARY

A light emitting diode (LED) is provided in the disclosure. By having indium concentrations of a light emitting layer and an auxiliary layer that constitute a quantum well in an active layer satisfying a specific proportion, the luminous intensity of the LED at the 222 nm-405 nm wavelength range can be enhanced.

An LED is provided in the disclosure. By having thicknesses of a light emitting layer and an auxiliary layer constituting a quantum well in an active layer or by having lattice constants of a light emitting layer, an auxiliary layer and a quantum barrier layer satisfying a certain relationship, the luminous intensity of the LED at the 222 nm-405 nm wavelength range can be enhanced.

An LED is provided in the disclosure. By forming a plurality of protuberances on a N-face of a GaN substrate, the total reflection angle of light emitted from the LED can be effectively adjusted to enhance the power extraction.

According to an exemplary embodiment of the disclosure, an LED that includes a substrate, an n-type semiconductor layer, a p-type semiconductor layer, an active layer, a first electrode and a second electrode is provided. The n-type semiconductor layer and the p-type semiconductor layer are located on the substrate. The active layer is located between the n-type semiconductor layer and the p-type semiconductor layer, in which the active layer includes i quantum wells and (i+1) quantum barrier layers. Each of the quantum wells is located between any two of the quantum barrier layers, where i is a natural number greater than or equal to 1. Each of k quantum wells among the i quantum wells is constituted of a light emitting layer and an auxiliary layer, in which an indium concentration of the auxiliary layer is greater than an indium concentration of the light emitting layer, where k is a natural number greater than or equal to 1 and k≤i. The first electrode and the second electrode are located on the n-type semiconductor layer and the p-type semiconductor layer, respectively.

According to another exemplary embodiment of the disclosure, an LED that includes a substrate, an n-type semiconductor layer, a p-type semiconductor layer, an active layer, a first electrode and a second electrode is provided. The n-type semiconductor layer and the p-type semiconductor layer are located on the substrate. The active layer is located between the n-type semiconductor layer and the p-type semiconductor layer, in which the active layer includes i quantum wells and (i+1) quantum barrier layers. Each of the quantum wells is located between any two of the quantum barrier layers, where i is a natural number greater than or equal to 1. Each of k quantum wells among the i quantum wells is constituted of a light emitting layer and an auxiliary layer, in which a lattice constant of the quantum barrier layer is $a_1$, a lattice constant of the light emitting layer is $a_2$ and a lattice constant of the auxiliary layer is $a_3$, $a_1<a_2<a_3$, where k is a natural number greater than or equal to 1 and k≤i. The first electrode and the second electrode are located on the n-type semiconductor layer and the p-type semiconductor layer, respectively.

According to yet another exemplary embodiment of the disclosure, an LED that includes a gallium nitride (GaN) substrate, an n-type semiconductor layer, an active layer, a p-type semiconductor layer, a first electrode and a second electrode is provided. The GaN substrate includes a first surface and a second surface, in which the first surface and the second surface are respectively disposed on two sides of the GaN substrate, and the second surface has a plurality of protuberances. A height of the protuberances is h μm, and a distribution density of the protuberances on the second surface is d $cm^{-2}$, in which $h^2 d \geq 9.87 \times 10^7$, and h≤1.8. The n-type semiconductor layer is disposed on the first surface of the GaN substrate. The active layer is disposed on the n-type semiconductor layer, and a wavelength of light emitted by the active layer is between 340 nm and 405 nm. The p-type semiconductor layer is disposed on the active layer. The first electrode and the second electrode are located on the n-type semiconductor layer and the p-type semiconductor layer, respectively.

To recapitulate, in the LED described in the embodiments of the disclosure, by having k layers of quantum wells individually constituted by auxiliary layer and light emitting layer in the active layer, in which the indium concentration of the auxiliary layer is greater than an indium concentration of the light emitting layer, or by having k layers of quantum wells individually constituted by auxiliary layer and light emitting layer in the active layer, in which the lattice constants among the auxiliary layer, the light emitting layer and the quantum barrier layer satisfy specific relationships, or by forming a plurality of protuberances satisfying specific conditions on the N-face of the GaN substrate which may further cooperated with the afore-described active layer (that includes k quantum wells having the auxiliary layer), the carrier recombination rate of the LED can be enhanced and the total reflection angle of the emitted light from the LED can be effectively adjusted to maintain a preferable power extraction. Accordingly, by employing any one of the afore-described techniques, the luminous intensity of the LED in the disclosure can be drastically increased.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
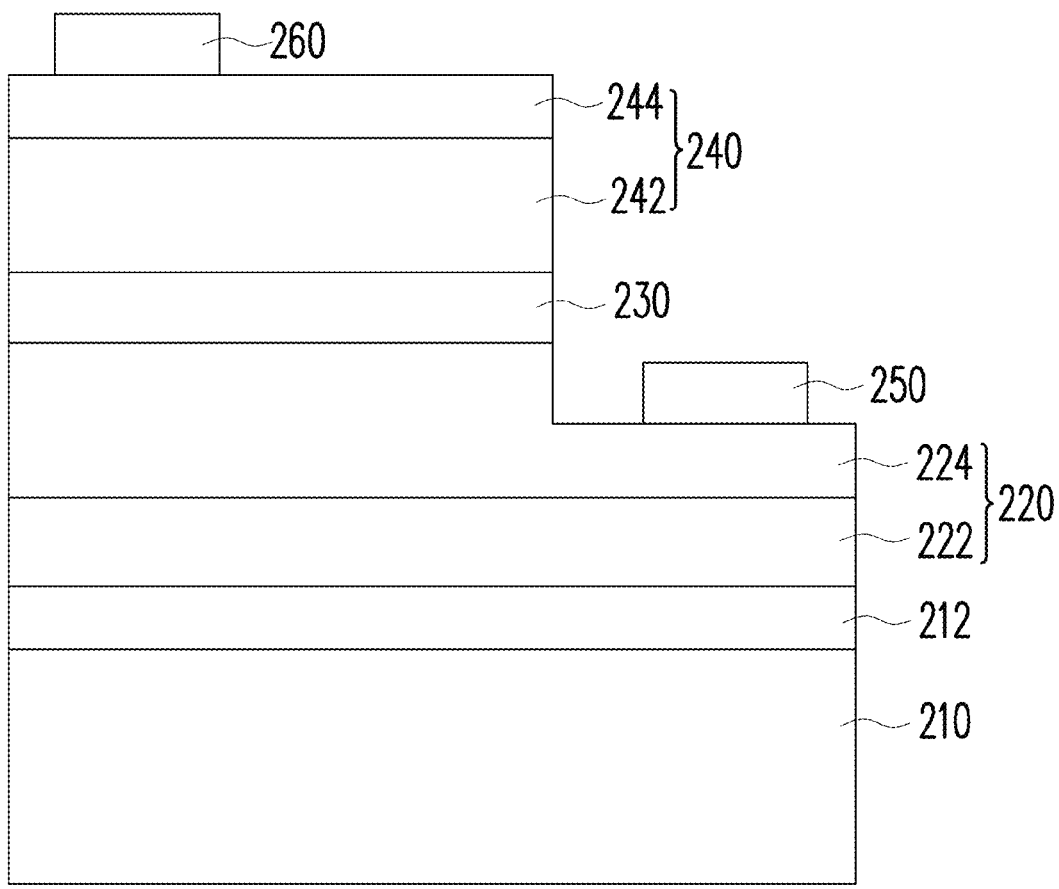
FIG. 1 is a schematic cross-sectional diagram illustrating an LED according to an exemplary embodiment.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic cross-sectional diagram illustrating an LED according to an exemplary embodiment. Referring to FIG. 1, an LED 200 includes a substrate 210, an n-type semiconductor layer 220, an active layer 230, a p-type semiconductor layer 240, a first electrode 250, and a second electrode 260. The substrate 210 is, for instance, a sapphire substrate, a gallium nitride (GaN) substrate, a silicon substrate, a silicon carbide (SiC) substrate or an aluminium nitride (AlN) substrate, in which the sapphire substrate and the GaN substrate are employed to respectively illustrate the exemplary embodiments of the disclosure, although the disclosure is not limited thereto. Specifically, the stacking layers of a nitride semiconductor capping layer 212 (e.g. un-doped GaN or un-doped AlN), a n-type semiconductor layer 220, an active layer 230, and a p-type semiconductor layer 240 are formed in sequence on a surface of the sapphire substrate 210. The active layer 230 is disposed between the n-type semiconductor layer 220 and the p-type semiconductor layer 240. The n-type semiconductor layer 220 may include the stacking layers of a first n-type doped GaN layer 222 and a second n-type doped GaN layer 224 disposed sequentially on the nitride semiconductor capping layer 212. The p-type semiconductor layer 240 may include the stacking layers of a first p-type doped GaN layer 242 and a second p-type doped GaN layer 244 disposed sequentially on the active layer 230. A difference between the first n-type doped GaN layer 222 and the second n-type doped GaN layer 224, or a difference between the first p-type doped GaN layer 242 and the second p-type doped GaN layer 244 may be in thickness or in doping concentration. Besides, a material of the n-type semiconductor layer 220 and the p-type semiconductor layer 240 may be AlGaN, for instance. According to requirements in practice, those skilled in the art may select the thickness, the doping concentration, and the aluminum concentration for growth of the nitride semiconductor capping layer 212, the first n/p-type doped GaN layers 222 and 242, the second n/p-type doped GaN layers 224 and 244, although the disclosure is not limited thereto.

Specifically, as shown in FIG. 1, the nitride semiconductor capping layer 212 (e.g. un-doped GaN or un-doped AlN), the first n-type doped GaN layer 222 and the second n-type doped GaN layer 224, the active layer 230, the first p-type doped GaN layer 242, and the second p-type doped GaN layer 244 are formed in sequence on the sapphire substrate 210. Moreover, the first electrode 250 and the second electrode 260 are respectively formed on a portion of the second n-type doped GaN layer 224 and the second p-type doped GaN layer 244, such that the first electrode 250 is electrically connected to the n-type semiconductor layer 220, and the second electrode 260 is electrically connected to the p-type semiconductor layer 240. Certainly, a nitride buffer layer may also be added between the sapphire substrate and the n-type semiconductor, although the disclosure is not limited thereto.

Figure 2A:
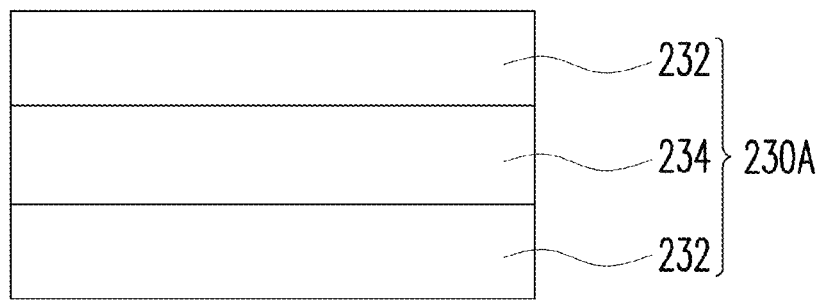
FIG. 2A is a schematic cross-sectional diagram illustrating an active layer having a single quantum well structure in an LED according to an exemplary embodiment.
Figure 2B:
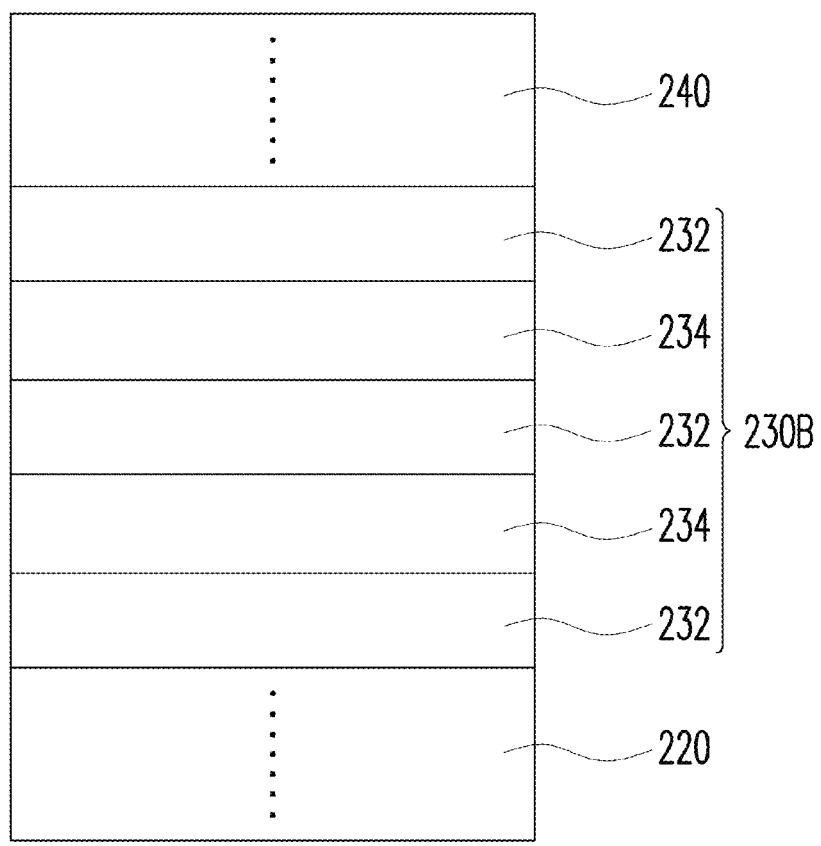
FIG. 2B is a schematic cross-sectional diagram illustrating an active layer having a multi-quantum well structure in an LED according to an exemplary embodiment.

The active layer 230, as shown in FIG. 2A and FIG. 2B, may be composed of a single quantum well (i.e., a single quantum well active layer 230A) or multiple quantum wells (i.e., a multi-quantum well active layer 230B). FIG. 2A is a schematic cross-sectional diagram illustrating an active layer having a single quantum well structure in an LED according to an exemplary embodiment. FIG. 2B is a schematic cross-sectional diagram illustrating an active layer having a multi-quantum well structure in an LED according to an exemplary embodiment. In general, the active layer 230 includes i quantum wells and (i+1) quantum barrier layers. Each of the quantum wells is located between any two quantum barrier layers, and i is a natural number greater than or equal to 1. For instance, as shown in FIG. 2A, the single quantum well active layer 230A may be formed by two quantum barrier layers 232 and a quantum well 234 sandwiched there between, thus constituting a quantum barrier layer 232/quantum well 234/ quantum barrier layer 232 structure. Taking the LED 200 with an emitted wavelength of 222 nm-405 nm as an example, a material of the quantum barrier layers 232 is $Al_xIn_yGa_{1-x-y}N$, wherein $0 \le x \le 1$, $0 \le y \le 0.3$, and $x+y \le 1$. Moreover, a material of the quantum well 234 may be $Al_mIn_nGa_{1-m-n}N$, wherein $0 \le m \le 1$, $0 \le n \le 0.5$, $m+n \le 1$, $x>m$, and $n \ge y$. According to requirements in practice, such as different emitted wavelengths, those skilled in the art may select the concentrations of m and n or x and y for growth, although the disclosure is not limited thereto.

On the other hand, the active layer 230, as shown in FIG. 2B, may be composed of multiple quantum wells (i.e., the multi-quantum well active layer 230B). The multi-quantum well active layer 230B may be formed by at least two pairs of stacked quantum barrier layers 232 and quantum wells 234. For instance, in FIG. 2B, the multi-quantum well active layer 230B is composed of three pairs of stacked quantum barrier layers 232/quantum wells 234.

Figure 3:
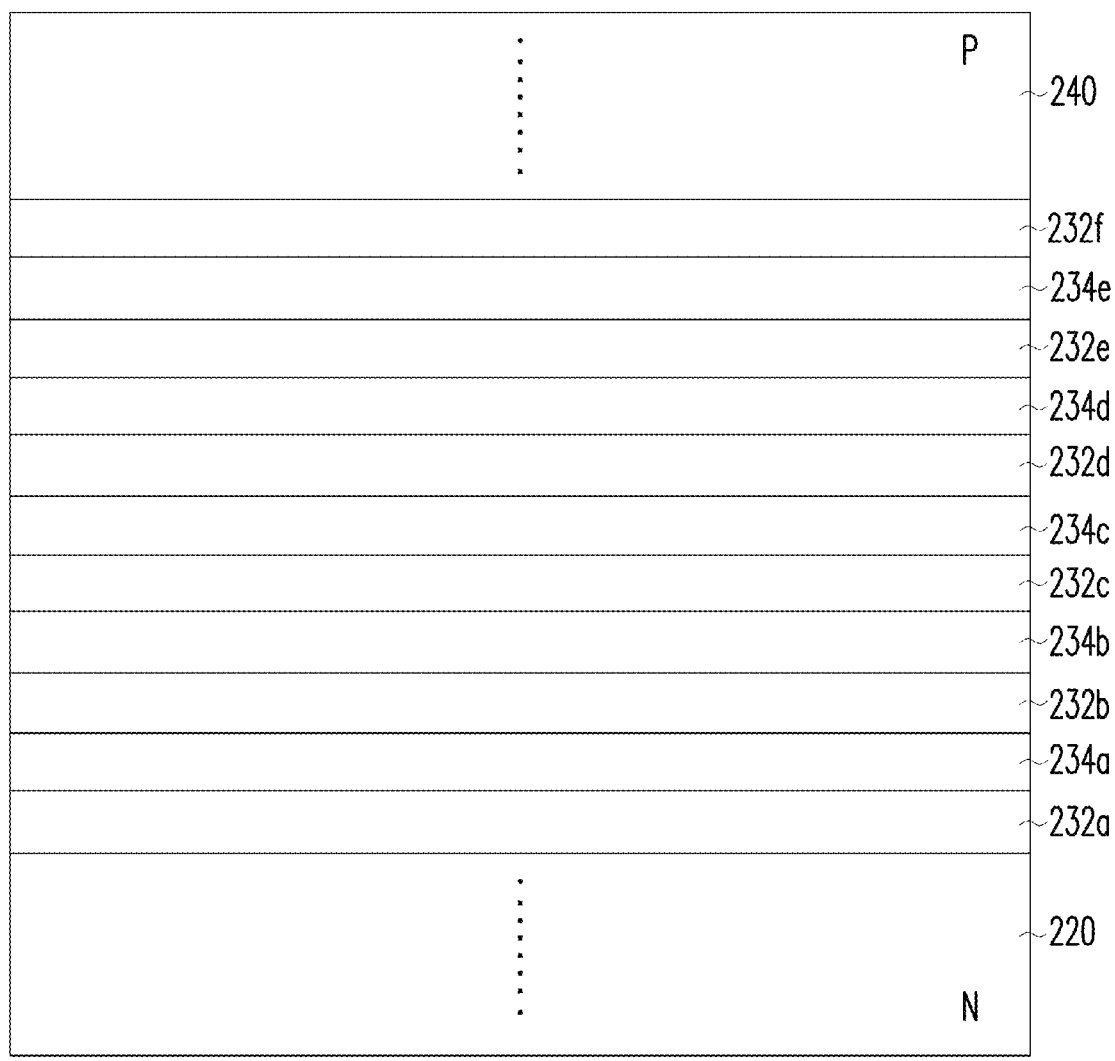
FIG. 3 is an enlarged schematic cross-sectional diagram illustrating an active layer in an LED according to an exemplary embodiment.

FIG. 3 is an enlarged schematic cross-sectional diagram illustrating an active layer in an LED according to an exemplary embodiment. Referring to FIG. 3, the active layer 230 described in the present embodiment includes five quantum wells 234a-234e and six quantum barrier layers 232a-232f. Each of the quantum wells 234a-234e is located between any two of the quantum barrier layers 232a-232f. The quantum barrier layers 232a-232f, counting from the n-type semiconductor layer 220, are sequentially 232a, 232b, 232c, 232d, 232e, and 232f, and the quantum wells 234a-234e, counting from the n-type semiconductor layer 220, are sequentially 234a, 234b, 234c, 234d, and 234e.

It should be noted that, in the active layer 230 of the LED 200 of the disclosure, a portion of the quantum wells 234 at different locations may be individually designed to have a pair of light emitting layer and auxiliary layer or to have two pairs of light emitting layer and auxiliary layer, and the rest of the quantum wells may be individually designed to have the light emitting layer. Moreover, by having indium concentrations of the light emitting layer and the auxiliary layer in the quantum well to satisfy a specific proportion or by having lattice constants of the light emitting layer, the auxiliary layer and the quantum barrier layer to satisfy a certain relationship, more electron-hole pairs can be distributed into the quantum wells 234 of the active layer 230, and thus the luminous intensity of the LED 200 at the 222 nm-405 nm wavelength range can be improved. In particular, with the portion of the quantum wells having the auxiliary layer, more self-assembled indium-riched regions are formed around the defects. Therefore, when carriers move to the defects, more carriers are captured by the self-assembled indium-riched regions, and thus increasing the carrier recombination rate. The enhancement of luminous intensity of the LED by way of the quantum wells having the auxiliary layer in the active layer, as described in the disclosure, will be further described with support from the experimental results provided below.

The effects of the LED 200 in the disclosure are further illustrated with support from the experimental results described below. In the embodiments hereafter, silicon is used as the n-type dopant as an exemplary scope for implementation, although those skilled in the art may also use other elements in the same group IVA as silicon to implement the embodiments in the disclosure by substituting the silicon. Alternatively, other elements in group V or group VIA such as arsenic, phosphorus or oxygen to implement the embodiments in the disclosure by substituting the silicon.

In the embodiments of the disclosure where the luminous wavelength is 365 nm, the material of the quantum wells is $In_cGa_{1-c}N$, in which $0 \le c \le 0.05$, and the material of the quantum barrier layers is $Al_dGa_{1-d}N$, in which $0 \le d \le 0.25$. In the embodiment, the preferable aluminium concentration is between 0.09 and 0.20, and the thickness of the quantum barrier layer is 5 nm-15 nm, for instance. The preferable thickness of the quantum barrier layer is 6 nm-11 nm in the embodiment.

Figure 4A:
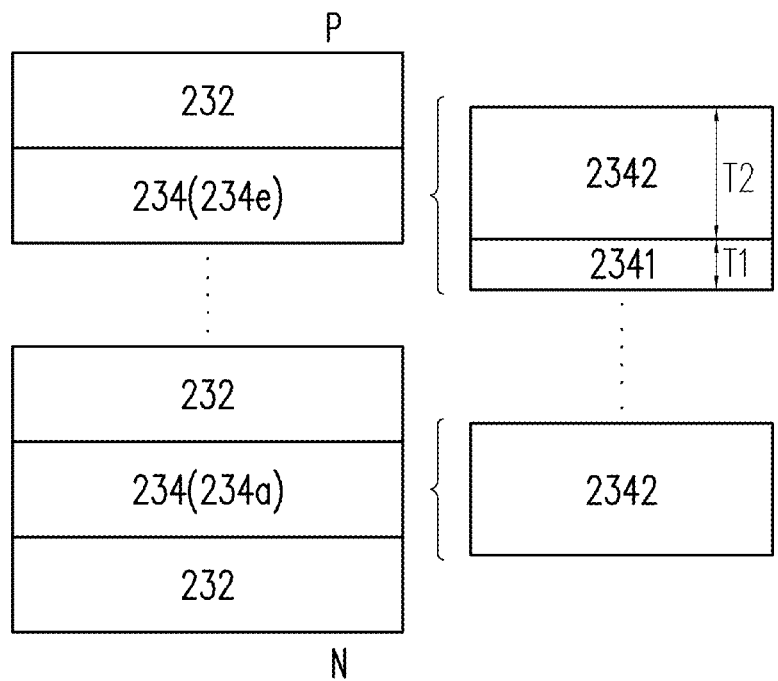
FIG. 4A and FIG. 4B respectively are schematic diagrams illustrating structure pattern of a single quantum well in the LED depicted in FIG. 1.
Figure 4B:
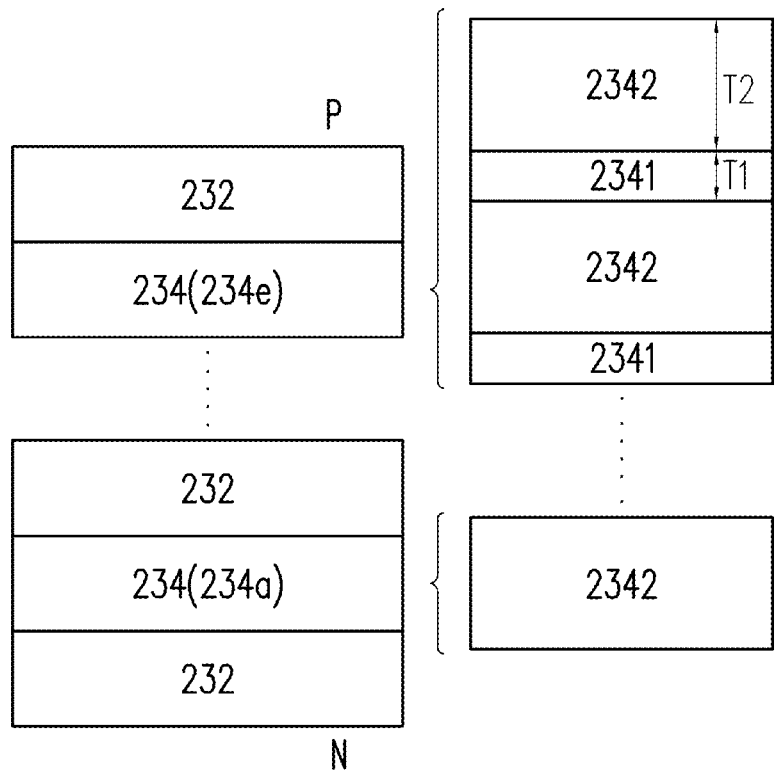

FIG. 4A and FIG. 4B respectively are schematic cross-sectional diagrams illustrating structure pattern of a single quantum well in the LED depicted in FIG. 1, in which FIG. 4A illustrates a pair of a light emitting layer and an auxiliary layer in a quantum well of the active layer, and FIG. 4B illustrates multiple pairs of a light emitting layer and an auxiliary layer in a quantum well of the active layer. Referring to FIG. 4A, in the active layer 230, each of a portion of the quantum wells may be constituted by a pair of an auxiliary layer 2341 and a light emitting layer 2342, and each of the rest of the quantum wells may be composed of a light emitting layer 2342. In the embodiment, the number of the quantum wells having the auxiliary layer 2341 is three, although the disclosure is not limited thereto.

As shown in FIG. 4A, the quantum well (e.g. the quantum well 234a closed to n-type semiconductor layer) is constituted of a light emitting layer, and in each of the quantum wells (e.g. the quantum well 234e closest to p-type semiconductor layer 240 as shown in FIG. 3) having the auxiliary layer 2341, the light emitting layer 2342 is disposed between the auxiliary layer 2341 and the p-type semiconductor layer 240 (as shown in FIG. 3 and FIG. 4A). For example, in the active layer 230 with the single quantum well (as shown in FIG. 2A), counting from the p-type semiconductor layer 240, the stacking layers of the quantum barrier layer 232, the light emitting layer 2342, the auxiliary layer 2341, the quantum barrier layer 232 are formed in sequence on the p-type semiconductor layer 240.

As shown in FIG. 4B, the single quantum well 234 (e.g. the quantum well 234e closest to p-type semiconductor layer 240, as shown in FIG. 3) in the active layer 230 can further have another pair of an auxiliary layer 2341 and a light emitting layer 2342, such that the single quantum well active layer 230A is a quantum barrier layer 232/two pairs of light emitting layer 2342 and auxiliary layer 2341 in the quantum well 234/quantum barrier layer 232 structure. The number of pairs of auxiliary layer 2341 and light emitting layer 2342 illustrated in the single quantum well of the embodiment is one and two, although the disclosure is not limited thereto.

In general, when the waveband is shifted close to the ultraviolet (UV) waveband, the indium concentration is gradually decreased in the active layer, such that the self-assembled indium-riched regions are lessened correspondingly. Consequently, the carriers are likely to move to the defect areas in the LED and the non-radiative recombination of electrons and holes may be occurred, thereby drastically decreasing the luminous intensity of the LED at the ultraviolet wavelengths.

By contrast, when the quantum well in the active layer is constituted by one pair or multiple pairs of auxiliary layer 2341 and light emitting layer 2342, the auxiliary layer 2341 is capable of increasing the self-assembled indium-riched regions formed in the light emitting layer 2342, thereby enhancing the luminous intensity of the LED, in which the indium concentration of the auxiliary layer 2341 is greater than the indium concentration of the light emitting layer 2342.

The luminous intensity of the LED results under different structures of the single quantum well depicted in FIG. 4A and FIG. 4B is shown in Table 1. It should be noted that the quantum well 234 without the auxiliary layer 2341 in the active layer 230 may be considered as composed of the light emitting layer 2342, in the embodiment.

TABLE 1

| LED 200 | Structure of a quantum well 234 | Output Power (mW) |
|---|---|---|
| I | a single quantum well | 79 |
| II | a pair (2342/2341) | 146 |
| III | two pairs (2342/2341/2342/2341) | 170 |

As shown in the results of Table 1, the output powers of the LED 200 increase as the number of auxiliary layers 2341 in the single quantum well becomes available. To be specific, when the quantum well 234 is composed of the light emitting layer 2342 (i.e., without the auxiliary layer 2341), the output power thereof is 79 mW. When the light emitting layers 2342 is disposed between the auxiliary layer 2341 and the p-type semiconductor layer 240 (such as, is located above the auxiliary layer 2341 close to the p-type semiconductor layer 240), the quantum well 234 is constituted by a pair of the auxiliary layer 2341 and the light emitting layer 2342, and the output power thereof is increased from 79 mW to 146 mW. When there are two pairs of auxiliary layer 2341 and light emitting layer 2342 in the single quantum well 234 (such as, counting from the p-type semiconductor layer 240, in a light emitting layer 2342/auxiliary layer 2341/light emitting layer 2342/auxiliary layer 2341 arrangement), the output power of the LED can be drastically increased from 79 mW to 170 mW, which is a twofold enhancement. Therefore, it can be inferred from the results presented in Table 1 that, by inserting the auxiliary layer 2341 between the light emitting layer 2342 and the n-type semiconductor layer 220, the luminous intensity of the LED 200 can be effectively increased.

In the multi-quantum well active layer (as shown in FIG. 2B), the enhancement effect of the luminous intensity is especially pronounced when a thickness of each quantum well 234 satisfies 10 Å≤$T_1$+$T_2$≤40 Å, namely, the sum of a thickness $T_1$ of the auxiliary layer 2341 and a thickness $T_2$ of the light emitting layer 2342 in each of the quantum wells is between 10 Å and 40 Å in the active layer. To be specific, when the total thickness of the single quantum well (whether the quantum well 234 is constituted by one or two pairs of auxiliary layer 2341 and light emitting layer 2342) is greater than 10 Å, more electrons and holes are distributed into the quantum well 234, and the recombination of the carriers in the LED can be more efficient. On the other hand, the total thickness of the single quantum well is designed to be less than 40 Å in the multi-quantum well active layer, so that the polarization field can be prevented. If the thickness of the quantum well is greater than 40 Å, the energy band of the LED may be bent, the electron and hole wavefunctions may be separated farther, such that the overlapping of the electron and hole wavefunctions in the quantum wells 234 is reduced, thereby decreasing the recombination rate of the electrons and holes.

Furthermore, when there are k layers of quantum well having the auxiliary layer 2341 in the active layer 230 of the LED 200, the total thickness $kT_1$ of the k auxiliary layers 2341 and the total thickness $kT_2$ of the k light emitting layers 2342 are designed to satisfy 1≤$kT_2/kT_1$≤7.04. In the embodiment, since the auxiliary layers 2341 are not involved with emitting light in the active layer 230, the total thickness of the auxiliary layers 2341 is designed to be less than the total thickness of the light emitting layers 2342, otherwise, the LED 200 cannot be performed effectively.

Under the k layers of quantum well having the auxiliary layer 2341 in the active layer 230 of the LED 200, since the indium concentration of the auxiliary layer 2341 is greater than the indium concentration of the light emitting layer 2342 in each of the k quantum wells, the atomic radius in the auxiliary layer 2341 is greater than the atomic radius in the light emitting layer 2342. Moreover, the quantum barrier layer 232 is utilized to combine with the quantum well 234, so that the energy gap of the quantum barrier layer 232 is the highest which indicates the atomic radius in the quantum barrier layer 232 is the smallest in comparison with the auxiliary layer 2341 and the light emitting layer 2342. In other words, the relationship among the lattice constants $a_1$, $a_2$, $a_3$ of the quantum barrier layer 232, the light emitting layer 2342 and the auxiliary layer 2341 is $a_1<a_2<a_3$. The enhancement effect of the luminous intensity is especially pronounced when a change rate between the lattice constants of the auxiliary layer 2341 and the light emitting layer 2342 in each of the quantum wells satisfies $[(a_3-a_2)/a_2]≤13.4\%$. Furthermore, when there are k layers of quantum well having the auxiliary layer 2341 in the active layer 230 of the LED 200, the change rate between the lattice constants of the auxiliary layer 2341 and the light emitting layer 2342 in each of the quantum wells satisfies $4.4\%≤[(a_3-a_2)/a_2]≤7.7\%$. Similarly, when the change rate obtained from the changes of the lattice constants $a_2$, $a_3$ of the auxiliary layer 2341 and the light emitting layer 2342 in each of k quantum wells 234, satisfies the relationship, i.e., $[(a_3-a_2)/a_2]≤13.4\%$, and more preferably, $4.4\%≤[(a_3-a_2)/a_2]≤7.7\%$, the effects such as distributing more electrons and holes into the quantum wells, improving the localized effect, increasing the recombination of the carriers in the LED and enhancing the luminous intensity may be achieved.

The formation of self-assembled indium-riched regions can be achieved by controlling the growth temperature of the quantum barrier layer 232 being higher than the growth temperature of the quantum wells 234 in the active layer 230. However, defects are likely to be generated in the quantum wells 234 by thermal damages during the process of heating the quantum barrier layers 232, and when the luminous wavelength of the LED is at the ultraviolet waveband, the self-assembled indium-riched regions are lessened due to the concentration of indium decreasing in the active layer, such that the quality of the active layer 230 is degraded by the thermal damages and the luminous intensity is affected. The impact on the luminous intensity at the 222 nm-405 nm wavelength range results from the difference in growth temperatures of the quantum barrier layers 232 in the LED 200, which is further explained below.

Figure 5A:
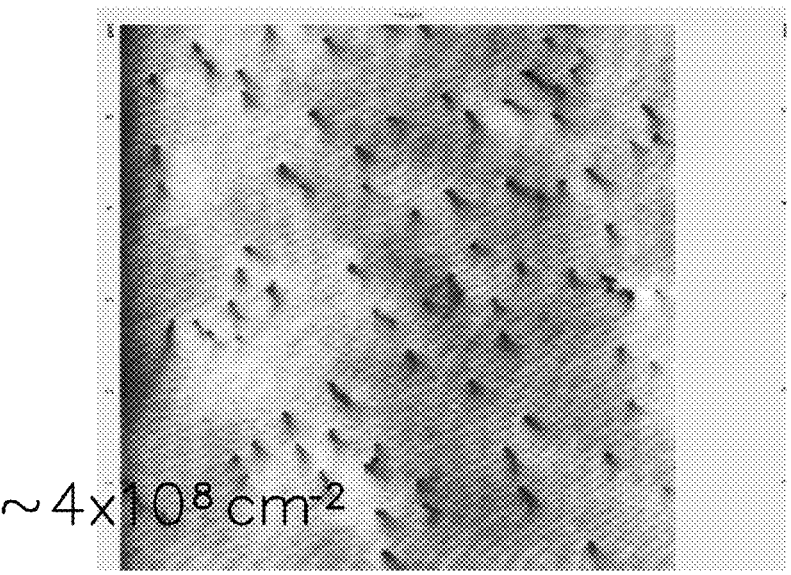
FIG. 5A and FIG. 5B are atomic force microscope (AFM) images illustrating defect densities of a surface of a quantum barrier layer in an active layer at different growth temperatures.
Figure 5B:
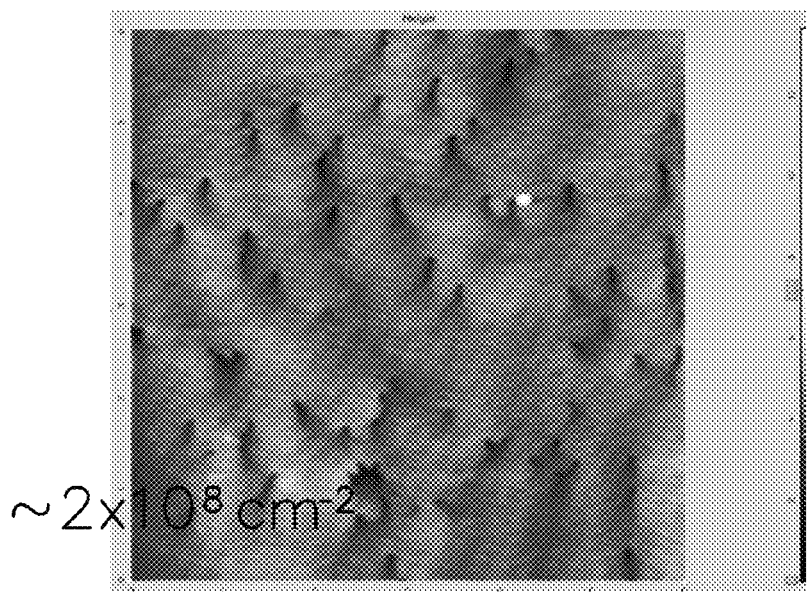
Figure 5C:
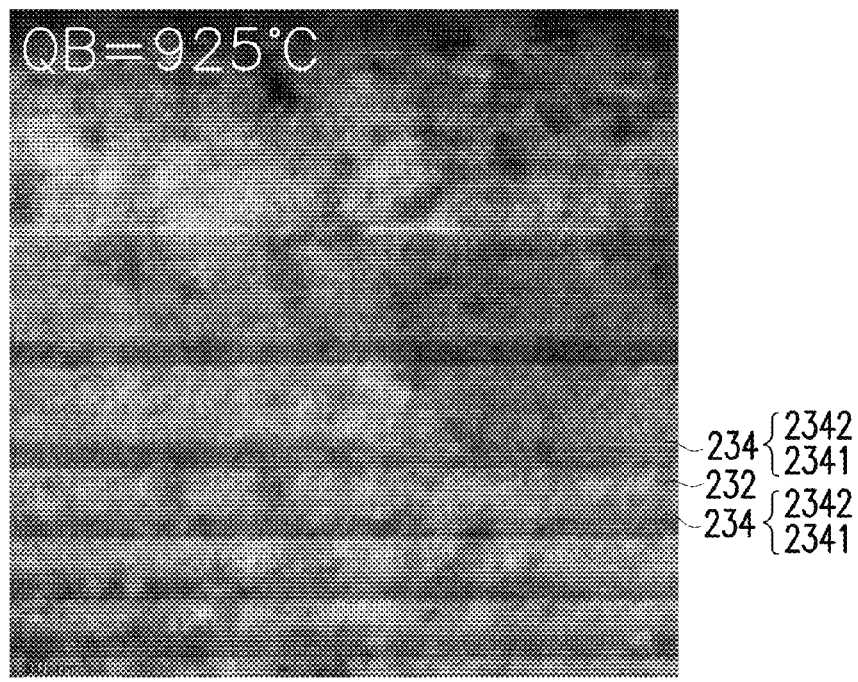
FIG. 5C and FIG. 5D are transmission electron microscopy (TEM) images illustrating a cross-sectional view of the active layer depicted in FIG. 5A and FIG. 5B.
Figure 5D:
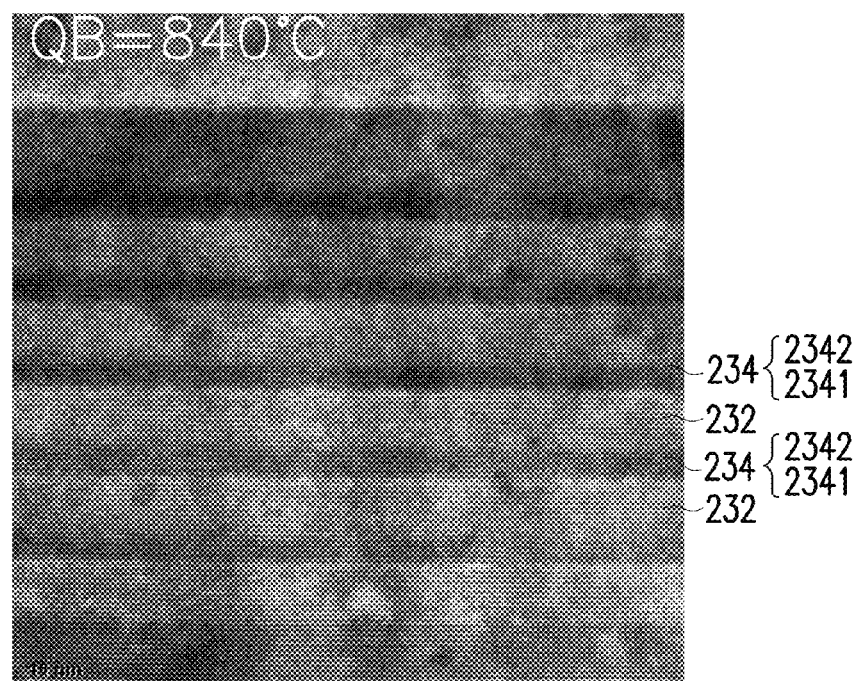

In the embodiment, it is assumed that the active layer 230 of the LED 200 includes k quantum wells 234 having the auxiliary layer 2341, and the current of 350 mA and the current of 700 mA are applied. On these conditions, when the growth temperatures of the quantum barrier layers 232 (unit: ° C.) are varied and the growth temperature of the quantum wells 234 (unit: ° C.) remains constant throughout, the luminous intensity and the forward voltage that result under different growth temperatures of the quantum barrier layers 232 in the LED 200 are provided in Table 2. Additionally, the results of the growth temperatures 840° C. and 925° C. of the quantum barrier layers 232 are respectively illustrated in FIG. 5A to FIG. 5D. FIG. 5A and FIG. 5B are atomic force microscope (AFM) images illustrating defect densities of a surface of a quantum barrier layer in an active layer at different growth temperatures. FIG. 5C and FIG. 5D are a transmission electron microscopy (TEM) images illustrating a cross-sectional view of the active layer respectively depicted in FIG. 5A and FIG. 5B.

TABLE 2

| LED | QB Layers 232 | Growth Temperature (° C.) of QWs 234 | Growth Temperature (° C.) of QB Layers 232 | Output Power (mW) at 350 mA | Output Power (mW) at 700 mA | Forward Voltage (V) at 350 mA | Reverse Leakage Current (nA) (−5 V) |
|---|---|---|---|---|---|---|---|
| I | AlGaN | 840 | 1000 | 73 | 122 | 4.6 | 11 |
| II | | | 925 | 85 | 165 | 4.3 | 28 |
| III | | | 840 | 99 | 173 | 4.5 | 52 |
| IV | | | 800 | 104 | 182 | 4.5 | 184 |

With reference to the quantum well structure depicted in FIG. 4A and FIG. 4B, as shown in Table 2, the output power of the LED increases as the growth temperature of the quantum barrier layers 232 gradually decreases and the growth temperature of the quantum wells 234 is fixed, which may be applicable to both conditions that the current of 350 mA and the current of 700 mA are applied. For example, the fixed growth temperature of the quantum wells 234 is 840° C. and the current of 350 mA is applied in the embodiment, the output power of the LED 200 is 73 mW when the growth temperature of the quantum barrier layers 232 is 1000° C. that may be considered as a high growth temperature. When the growth temperature of the quantum barrier layers 232 is 925° C. (which is also considered as a high growth temperature), the output power of the LED 200 is increased from 73 mW to 85 mW. Preferably, when the growth temperature of the quantum barrier layers 232 is 840° C. (which is the same temperature as the quantum wells 234), the output power of the LED 200 can be increased from 73 mW to 99 mW. Moreover, when the growth temperature of the quantum barrier layers 232 is 800° C. (which is a relatively low growth temperature than the quantum wells 234), the output power of the LED 200 can be enhanced to 104 mW. Therefore, it can deduced from Table 2 that the luminous intensity of the LED 200 can be effectively enhanced as the growth temperature of the quantum barrier layers 232 decreases, while the growth temperature of the quantum wells 234 remains constant throughout.

However, although the luminous intensity of the LED 200 is effectively enhanced, it should be noted that the reverse leakage current of the LED 200 also increases as the growth temperature of the quantum barrier layers 232 decreases. In particular, when the growth temperature of the quantum barrier layers 232 is lower than the growth temperature of the quantum wells 234, the reverse leakage current is drastically increased. For example, as shown in Table 2, the reverse leakage current of the LED 200 is 52 nA when the growth temperature of the quantum barrier layers 232 equals to the growth temperature of the quantum wells 234 (i.e., both growth temperatures are 840° C.). When the growth temperature of the quantum barrier layers 232 is decreased to 800° C. lower than that of the quantum wells 234, the reverse leakage current of the LED 200 is rapidly increased to 184 nA, which is a threefold enhancement. It can be seen that the enhancement of luminous intensity becomes less as the growth temperature of the quantum barrier layers 232 is lower than the growth temperature of the quantum wells 234, due to the drastically increased reverse leakage current. According to the experimental results described above, the enhancement effect is especially pronounced when the growth temperatures of the quantum barrier layers 232 and the quantum wells 234 are equal to each other.

Concurrently, referring to FIG. 5A through FIG. 5D, when the growth temperature of the quantum barrier layers 232 is 925° C. higher than that of the quantum wells 234, the defect density of the last grown quantum barrier layer 232 in the active layer 230 is $4 \times 10^8$ cm$^{-2}$ and the phenomenon of lattice dislocation extending in a thickness direction can be seen from FIG. 5C, thereby worsening the junction quality between the quantum barrier layers 232 and the quantum wells 234 in the active layer 230. By contrast, when the growth temperature of the quantum barrier layers 232 is decreased to 840° C. same as that of the quantum wells 234, the defect density of the last grown quantum barrier layer 232 in the active layer 230 is reduced to $2 \times 10^8$ cm$^{-2}$, and it can be seen from FIG. 5D that the lattice dislocation extending in the thickness direction is effectively reduced, thereby improving the junction quality between the quantum barrier layers 232 and the quantum wells 234 in the active layer 230.

Moreover, it is conventionally know that heating the growth temperature of the quantum wells 234 to the growth temperature of the quantum barrier layers 232 and cooling the growth temperature of the quantum barrier layers 232 to the growth temperature of the quantum wells 234, both procedures require a period of time to process. Since the growth temperatures of the quantum barrier layers 232 and the quantum wells 234 are the same, the time period for heating/cooling can be omitted in the disclosure, such that the overall crystal growth of the LED can be further reduced, thereby enhancing the production capacity of LEDs. Furthermore, it should be noted that the temperature differences between the growth temperatures of the quantum barrier layers 232 and the quantum wells 234 can be varied according to an actual requirement. For example, as the growth temperature of the quantum wells 234 is taken 840° C. as an example in the embodiment, the growth temperature of the quantum barrier layers 232 can be 920° C./830° C. or 820° C./800° C. instead of 925° C. and 840° C. shown in Table 2. In other words, the temperature difference between the growth temperatures of the quantum barrier layers 232 and the quantum wells 234 can be in the range of −40° C. to 80° C., preferably −20° C. to 50° C., and more preferably no temperature difference (i.e., same temperature), such that the luminous intensity of the LED 200 can be enhanced.

According to the experimental results described above, it can be deduced that the luminous intensity of the LED can be effectively improved by having k layers of quantum wells 234 individually constituted by one or two pairs of auxiliary layer 2341 and light emitting layer 2342 in the active layer 230 and by having the growth temperature of the quantum barrier layers 232 and the quantum wells 234 being identical. Particularly, the enhancement effect is especially pronounced for the light that is emitted from the active layer 230 and has a wavelength range from 222 nm to 405 nm.

Moreover, in the LED 200 of the disclosure, other than including k quantum wells 234 individually constituted by one or two pairs of auxiliary layer 2341 and light emitting layer 2342, a n-type dopant doping process is performed on the quantum barrier layers 232 in the active layer 230, so as to adjust a layer number of doped quantum barrier layers 232 in the quantum barrier layers 232 with different growth temperatures of the quantum barrier layers 232 in order to enhance the luminous efficiency of the LED 200 at the 222 nm-405 nm wavelengths. Specifically, although GaN growth techniques are limited by a certain amount of defect density inherent in fabrication, however, even when the active layer 230 in the LED 200 has a defect density on the order of $10^7/cm^3$, the effect of the defect density in the active region on the carriers can be lowered by doping n-type dopants through adjusting the layer number of the doped quantum barrier layers 232 and the growth temperatures of the quantum barrier layers 232 in the active layer 230, thereby enhancing the luminous intensity. In the disclosure below, the effects that the number of the doped quantum barrier layers 232 and the different growth temperatures of the quantum barrier layers 232 have on the luminous intensity of the LED at the 222 nm-405 nm wavelength range are further discussed with support from the experimental results.

Table 3 records experiments of an LED having the active layer structure as depicted in FIG. 4A/FIG. 4B. As shown in Table 3, the active layer 230 described in the embodiment includes five quantum wells and six quantum barrier layers, for instance, in which the doping concentration of the n-type dopants (e.g. Si) in the quantum barrier layers 232 is $2\times10^{18}/cm^3$, the growth temperature of the quantum wells 234 remains 840° C. throughout, and the currents of 350 mA and 700 mA are applied.

with n-type dopants can provide electrons to increase the electron-hole radiative recombination rate, thereby effectively enhancing the luminous intensity of the LED. At the same time, the non-radiative recombination rate of electrons and holes which results in non-light emitting states such as heat is lowered, and this can also verify the deduced result that the n-type dopants are capable of enhancing the luminous intensity of the LED at the 222 nm-405 nm wavelength range.

The foregoing results represent that by increasing the number of doped layers in the quantum barrier layers, the effect of defect density has on the luminous efficiency of the LED at the 222 nm-405 nm wavelength range (main peak at around 365 nm) can be compensated. In other words, the n-type dopants injected in the quantum barrier layers can effectively provide electrons for radiative recombination, and lower energy release from non-radiative recombination such as heat. Accordingly, the luminous efficiency can be effectively enhanced. Similarly, by increasing the doping concentration of the n-type dopants (e.g. Si) in the quantum barrier layers 232, the effect of defect density has on the luminous efficiency of the LED at the 222 nm-405 nm wavelength range can also be effectively compensated.

Besides the doping concentration in the doped quantum barrier layers being equal to the value tabulated in Table 3, the doping concentration may also have a laddered variation in the quantum barrier layers 232. As an example, the total number of quantum barrier layers is six, and four of the six layers are doped quantum barrier layers. The doping concentrations of the four doped quantum barrier layers are $C_1$, $C_2$, ... $C_k$, where $C_k \leq C_{k-1}$, counting sequentially from the n-type

TABLE 3

| | Total QB Layers 232 i = 6 | | | | | |
|---|---|---|---|---|---|---|
| LED 200 | Doped QB Layers | Un-Doped QB Layers | Doping Concentration (cm$^{-3}$) | Growth Temperature (° C.) of QB Layers 232 | Output Power (mW) at 350 mA / at 350 mA | Forward Voltage (V) at 350 mA |
| I | 4 | 2 | $\sim 2 \times 10^{18}$ | 925 | 17 / 36 | 4.3 |
| II | 6 | 0 | | 925 | 31 / 58 | 4.1 |
| III | | | | 840 | 70 / 125 | 4.2 |

As shown in the results of Table 3, the output power of the LED increases as the layer number of the doped quantum barrier layers 232 increases when the growth temperatures of the quantum barrier layers 232 are identical, on the other hand, the output power of the LED also increases as the growth temperature of all the doped quantum barrier layers 232 decreases. Specifically, when four layers in the six layers of quantum barrier layers are doped with n-type dopants (e.g., purposely doping the four quantum barrier layers 232a-232d in the quantum barrier layer 232a-232f depicted in FIG. 3 closest to the n-type semiconductor layer 220) at the growth temperature of 925° C., the output power of the LED 200 is 17 mW as the current of 350 mA is applied, and when all six layers of quantum barrier layers 232a-232f are doped with n-type dopants at the same growth temperature, the output power of the LED 200 can be increased from 17 mW to 31 mW. Moreover, as all the quantum barrier layers 232a-232f of the active layer 230 are doped, when the growth temperature of the quantum barrier layers 232 is decreased from 925° C. to 840° C. (same as the growth temperature of the quantum wells 234), the output power of the LED 200 can be drastically increased from 31 mW to 70 mW, which is a twofold enhancement. Therefore, doping the quantum barrier layers semiconductor side. Taking the quantum barrier layers 232a-232f depicted in FIG. 3 as an example, the doping concentrations of the four doped quantum barrier layers 232a-232d are $6\times10^{18}$ cm$^{-3}$, $5\times10^{18}$ cm$^{-3}$, $4\times10^{18}$ cm$^{-3}$, and $3\times10^{18}$ cm$^{-3}$ in sequence. In other words, the doping concentrations of the doped quantum barrier layers vary through gradually decreasing from the first quantum barrier layer 232a closest to the n-type semiconductor side to the fourth layer 232d closest to the p-type semiconductor side. Accordingly, the n-type dopants injected can also effectively provide electrons for radiative recombination, and thereby enhance the luminous efficiency.

Additionally, the laddered variation of the doping concentrations $C_1$ to $C_k$ in the doped quantum barrier layers may also be $6\times10^{18}$ cm$^{-3}$, $7\times10^{18}$ cm$^{-3}$, $8\times10^{18}$ cm$^{-3}$, and $6\times10^{18}$ cm$^3$ in sequence counting from the n-type semiconductor side. In other words, the variation of the doping concentrations may be in a state where the doping concentrations of the middle layers are greater than the doping concentrations of the layers nearest to the n-type semiconductor and the p-type semiconductor. Moreover, the laddered variation of the doping concentrations in the doped quantum barrier layers may also be $6\times10^{18}$ cm$^{-3}$, $5\times10^{18}$ cm$^{-3}$, $8\times10^{18}$ cm$^{-3}$, and $6\times10^{18}$ cm$^{-3}$ in sequence counting from the n-type semiconductor side. To sum up, as long as the doping concentration of the doped quantum barrier layer nearest to the p-type semiconductor layer is less than or equal to the doping concentrations of the other doped quantum barrier layers, the injected n-type dopants can effectively provide electrons for radiative recombination, and thereby enhance the luminous efficiency.

According to the experimental results described above, it can be deduced that the luminous intensity of the LED can be effectively improved by having k layers of quantum wells 234 individually constituted by one or two pairs of auxiliary layer 2341 and light emitting layer 2342 in the active layer 230 and by increasing the number of doped layers in the quantum barrier layers 232/varying the doping concentration of the n-type dopants (e.g. Si) in the quantum barrier layers 232, in which the structural variation of the active layer 230 and the doping concentration arrangement of the quantum barrier layers 232 can be implemented individually and/or collectively in order to enhance the luminous intensity of the LED. Particularly, the enhancement effect is especially pronounced for the light that is emitted from the active layer 230 and has a wavelength range from 222 nm to 405 nm.

Figure 6:
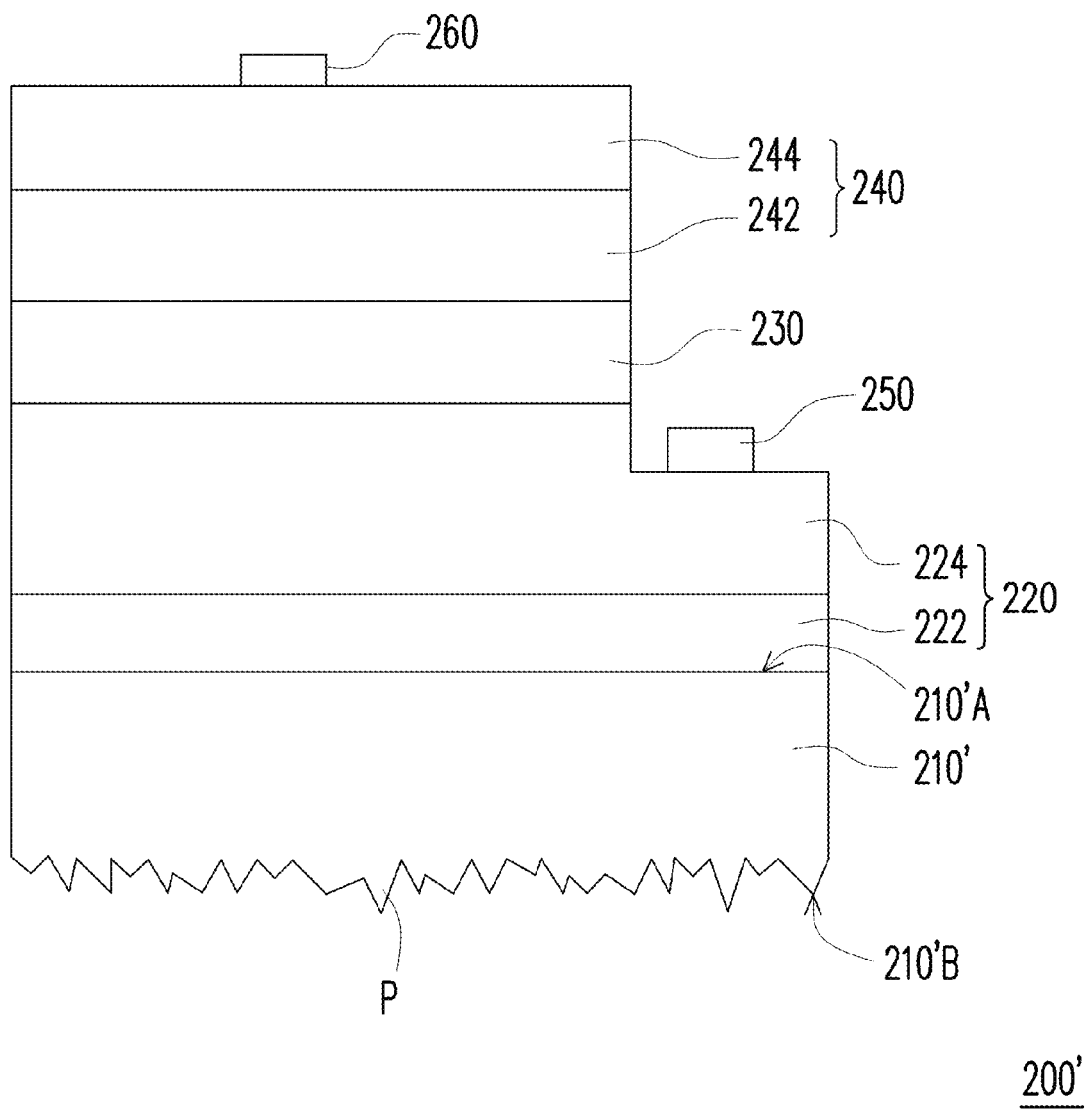
FIG. 6 is a schematic cross-sectional diagram illustrating an LED according to another exemplary embodiment.

FIG. 6 is a schematic cross-sectional diagram illustrating an LED according to another exemplary embodiment. Referring to FIG. 6, the LED 200' of the embodiment is similar to the LED 200 depicted in FIG. 1, except the substrate of the LED 200' is a gallium nitride (GaN) substrate 210' in which the GaN substrate 210' includes a first surface 210'A and a second surface 210'B, and the second surface 210'B in the embodiment is a nitride surface of the GaN substrate 210', for instance. The n-type semiconductor layer 220, the active layer 230 and the p-type semiconductor layer 240 are stacked in sequence on the first surface 210'A of the GaN substrate 210'. Specifically, the n-type semiconductor layer 220 is disposed on the first surface 210'A of the GaN substrate 210'. The active layer 230 is disposed on a portion of the n-type semiconductor layer 220 in which the wavelength of light emitted by the active layer is between 340 nm and 405 nm. The p-type semiconductor layer 240 is disposed on the active layer 230. The first electrode 250 and the second electrode 260 are respectively located on the n-type semiconductor layer 220 and the p-type semiconductor layer 240. For example, the first electrode 250 is disposed on a portion of the n-type semiconductor layer 220 to electrically connect to the n-type semiconductor layer 220, and the second electrode 260 is disposed on a portion of the p-type semiconductor layer 240 to electrically connect to the p-type semiconductor layer 240.

In the embodiment, as the active layer 230 depicted in FIG. 2A and FIG. 2B, the active layer 230 may be composed of a single quantum well (i.e., a single quantum well active layer 230A) or multiple quantum wells (i.e., a multi-quantum well active layer 230B), so that the detailed description may be referred to the descriptions above, which is not repeated therein.

Moreover, referring to FIG. 6, the thickness of the GaN substrate 210' in the embodiment is between 70 µm to 200 µm, preferably between 70 µm to 120 µm, and the second surface 210'B has a plurality of protuberances P forming a rough surface. Accordingly, other than reducing the light absorption rate as light passes through the GaN substrate 210', the total internal reflection effect generated at the second surface 210'B can also be lowered when light passes through the GaN substrate 210', thereby enhancing the luminous intensity of the LED 200'. It should be noted that the second surface 210'B of the GaN substrate 210' having the plurality of protuberances P formed thereon is facilitated to improve a power extraction of a particular wavelength. Specifically, an enhancement effect is improved when the light emitted by the active layer 230 is at the 340 nm-405 nm wavelength range.

In the following descriptions, the schematic diagrams illustrating a fabrication process of the LED 200' with the structure of the afore-described GaN substrate 210' are provided, although the implementations below do not limit the disclosure.

Figure 7:
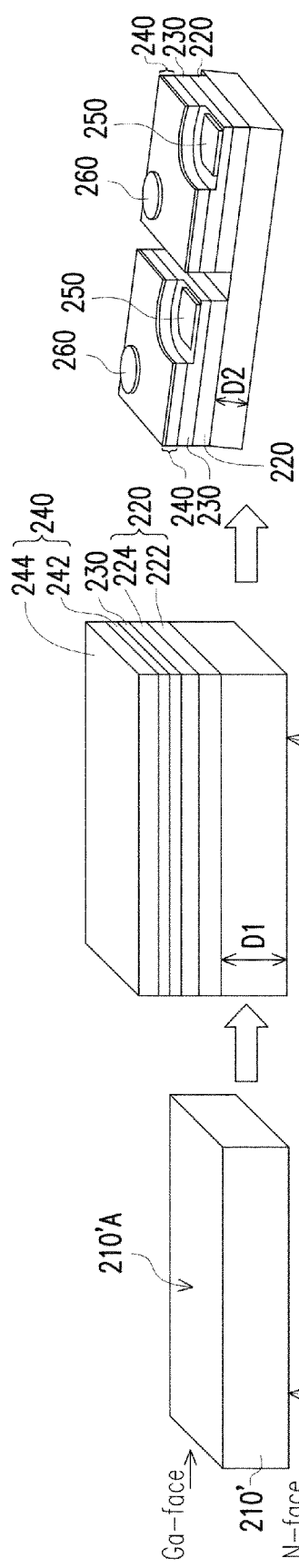
FIG. 7A through FIG. 7E are schematic cross-sectional diagrams illustrating a fabricating process of an LED according to an exemplary embodiment.

FIG. 7A through FIG. 7E are schematic cross-sectional diagrams illustrating a fabricating process of an LED according to an exemplary embodiment. Referring to FIG. 7A, a GaN substrate 210' is provided, in which a gallium surface (Ga-face) of the GaN substrate 210' serves as the first surface 210'A for forming a predetermined device thereon. A nitride surface (N-face) of the GaN substrate 210', the second surface 210'B serves as a light emitting surface (as shown in FIG. 7D). Thereafter, referring to FIG. 7B, film layers such as the n-type semiconductor layer 220 including the first n-type doped GaN layer 222 and a second n-type doped GaN layer 224, the active layer 230, and the p-type semiconductor layer 240 are formed in sequence on the first surface 210'A of the GaN substrate 210'. Next, referring to FIG. 7C, a plurality of LEDs 200' depicted in FIG. 6 are formed on the first surface 210'A of the GaN substrate 210' using chip fabrication processes, in which each of the LEDs 200' includes the GaN substrate 210', the n-type semiconductor layer 220, the active layer 230, the p-type semiconductor layer 240 including the first p-type doped GaN layer 242 and the second p-type doped GaN layer 244, the first electrode 250 and the second electrode 260.

It should be noted that a fabrication technique is employed to thin the thickness of the GaN substrate 210' in the embodiment, so that a thickness D1 of the GaN substrate 210' is reduced to a thickness D2 according to FIG. 7B and FIG. 7C, in which the thickness D2 after thinning the GaN substrate 210' is approximately between 70 µm and 200 µm. The method for thinning the thickness may be a mechanical polishing method or an etching method, for instance. Accordingly, the absorption effect of the emitted light from the active layer 230 can be initially lowered when passing through the GaN substrate 210', and thus enhancing the power extraction.

Thereafter, referring to FIG. 7D, the N-face (i.e., a predetermined forming surface 210' b of the second surface 210'B) of the GaN substrate 210' is etched by a wet etching technique, so as to form a plurality of protuberances P on the N-face of the GaN substrate 210'. Accordingly, the plurality of protuberances P on the second surface 210'B can be utilized to reduce the total internal reflection effect when light is emitted from the GaN substrate 210' interface, thereby further enhancing the power extraction. The structure of the protuberances P formed on the second surface 210'B will be described in detail later. Next, referring to FIG. 7E, the GaN substrate 210' is divided to form a plurality of LEDs 200' with high power extraction. In another embodiment, the GaN substrate 210' may be firstly divided to form the plurality of LEDs 200', and then the wet etching technique is performed on each of the divided GaN substrates 210' so as to thin the thickness of the GaN substrate 210', although the fabrication process of the LED in the disclosure is not limited thereto.

The power extraction and the luminous intensity of the LED 200' can be effectively enhanced by adjusting the plurality of protuberances P on the second surface 210'B of the GaN substrate 210'. Specifically, in the embodiment, by using a KOH solution with a concentration of 2M for etching the N-face of the GaN substrate 210', the protuberances P formed on the second surface 210'B of the GaN substrate 210' appear to be sawtooth shaped pyramids after etching, for instance. Those skilled in the art may also select sulfuric acid or other etching solutions to perform the wet etching process. Moreover, the height and the distribution density of the protuberances P on the second surface 210'B can also be controlled by adjusting the variety, concentration, and etching time of the selected etching solution. Particularly, when the height and the distribution density of the protuberances P on the second surface satisfy a condition, a total reflection angle of the emitted light from the LED can be effectively adjusted and a preferable power extraction can be achieved in the GaN substrate of the LED in the disclosure.

Figure 8:
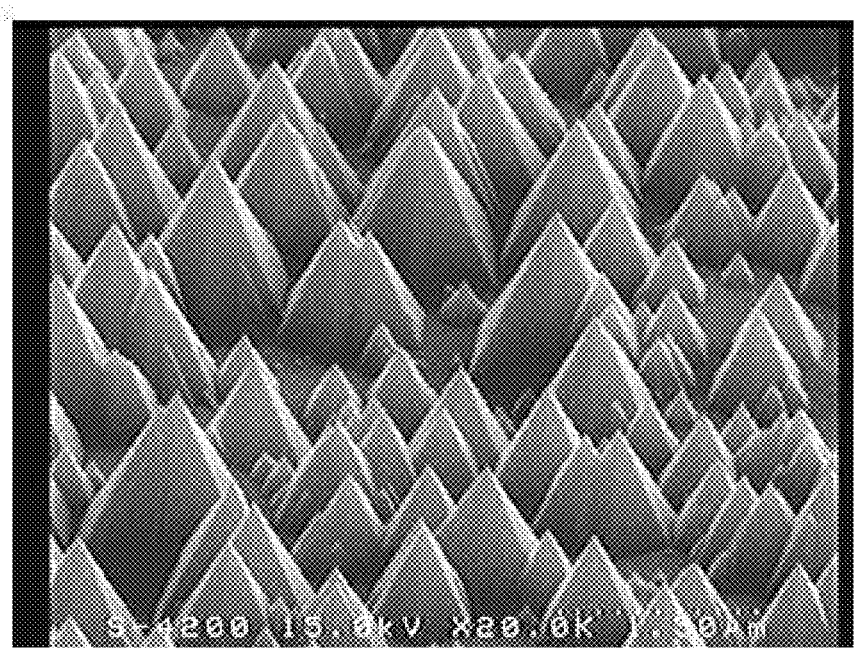
FIG. 8 is a scanning electron microscope (SEM) image illustrating a top view of protuberances on a GaN substrate according to an exemplary embodiment.
Figure 9:
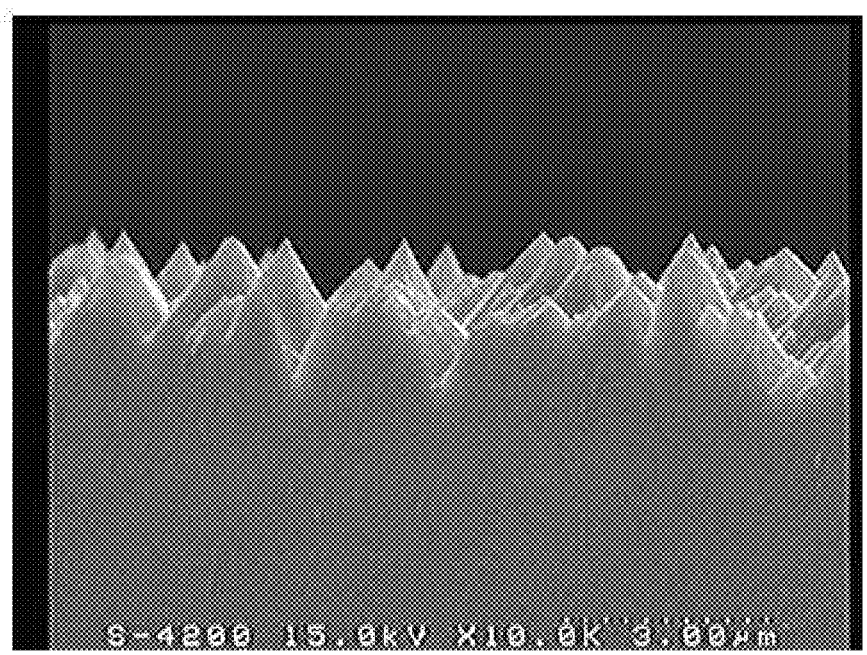
FIG. 9 is a SEM image illustrating a cross-sectional view of protuberances on the GaN substrate depicted in FIG. 8.

FIG. 8 is a scanning electron microscope (SEM) image illustrating a top view of protuberances on a GaN substrate according to an exemplary embodiment. FIG. 9 is a SEM image illustrating a cross-sectional view of protuberances on the GaN substrate depicted in FIG. 8. Referring to FIG. 8 and FIG. 9, the protuberances P appear to be pyramidal shaped after the N-face of the GaN substrate 210' has been etched. According to the lattice arrangement of the GaN substrate 210', each of the formed pyramids displays a hexagonal pyramid shape, and a characteristic angle of 58 degrees is included between the apex and the bottom surface of each pyramid, for instance. Hence, in the embodiment, when the height of the protuberance is h μm, an area of the bottom surface of the pyramid is $6 \times h^2 \times \cot^2 58° \times \sin 60° \cos 60°$, and the distribution density d $cm^{-2}$ of the pyramid can be derived in a unit area of 1 $cm^2$, through dividing the unit area by the area of the bottom surface of the pyramid. That is to say, the distribution density d of the protuberances P on the unit area can be calculated as $d=(10^4 \times 10^4)/(6 \times h^2 \times \cot^2 58° \times \sin 60° \cos 60°)$. In theory, the relationship between the height h of the protuberances P and the distribution density d of the protuberances P on the second surface 210'B can be calculated as $h^2 d=(10^4 \times 10^4)/(6 \times \cot^2 58° \times \sin 60° \cos 60°)$. The above calculation is a theoretically calculated value based on the pyramids being arranged in a most sparse manner in the unit area. Accordingly, the height h and the distribution density d of the protuberances P on the second surface 210'B satisfy the condition: $h^2 d \geq 9.87 \times 10^7$, and $h \leq 1.8$.

Table 4 records the luminous intensities of an LED using GaN as substrate under different etching times according to an exemplary embodiment. Moreover, Table 4 also lists the luminous intensities of an LED using sapphire and patterned sapphire as substrates for comparison. In the etching process, a KOH solution with a 2M concentration is used, and the etching times are 10 minutes and not etched, respectively. Furthermore, the current of 350 mA is applied to the LED at the 365 nm wavelength of light, and the current of 20 mA is applied to both the LEDs at the 405 nm and 450 nm wavelengths of light. The results are tabulated in Table 4 below.

TABLE 4

| Wavelength of Emitted Light from LED 200' | Substrate | Etching Time (min) | Output power (mW) |
|---|---|---|---|
| 365 nm | Sapphire Substrate | 0 | 26.4 |
|  | Patterned Sapphire Substrate | 0 | 33.0 |
|  | GaN substrate | 0 | 26.4 |
|  |  | 10 | 64.1 |
| 405 nm | Sapphire Substrate | 0 | 19.0 |
|  | Patterned Sapphire Substrate | 0 | 23.5 |
|  | GaN substrate | 0 | 13.2 |
|  |  | 10 | 25.6 |
| 450 nm | Sapphire Substrate | 0 | 19.5 |
|  | Patterned Sapphire Substrate | 0 | 24.3 |
|  | GaN substrate | 0 | 18.6 |
|  |  | 10 | 24.0 |

As shown in the results of Table 4, the output power of the LED increases after the GaN substrate has beeen etched, in particular, the LED at the 365 nm wavelength of light. Specifically, the output power of the LED at the 450 nm wavelength of light increases from 18.6 mW without being etched to 24.0 mW after being etched for 10 minutes, the output power of the LED at the 405 nm wavelength of light increases from 13.2 mW without being etched to 25.6 mW after being etched for 10 minutes, and the output power of the LED at the 365 nm wavelength of light is drastically enhanced from 26.4 mW without being etched to 64.1 mW after being etched for 10 minutes. In comparison with the LEDs using sapphire substrates and patterned sapphire substrates (PSS), the LED 200' in the disclosure has favorable luminous intensity over the LED using the sapphire substrate and the PSS. Hence, by fabricating a plurality of protuberances P on the N-face of the GaN substrate and by having the height and distribution density of the protuberances P satisfying the afore-described conditions, the total reflection angle can be effectively adjusted and the power extraction can be enhanced.

Since the light absorption effect of the GaN substrate is higher than the sapphire substrate and the PSS, the power extraction of the LED using the GaN substrate is lower than or equal to that of the LEDs using the sapphire substrate and the PSS before forming the protuberances P without etching according to Table 4. However, after the protuberances P are formed by the etching process, the power extraction of the LED using the GaN substrate is favorable over that of the LEDs using the sapphire substrate and the PSS, and the enhancement effect is especially pronounced for the power extraction at a wavelength of 365 nm.

Moreover, besides fabricating a plurality of protuberances P on the N-face of the GaN substrate and having the height and distribution density of the protuberances P satisfying the afore-described conditions so as to effectively adjust the total reflection angle of the light emitted from the LED to enhance the power extraction, the active layer 230 in the LED 200' of the embodiment can be further designed into a portion of the quantum wells individually constituting by one or two pairs of auxiliary layer and light emitting layer as described above (where the rest of the quantum wells are composed of the light emitting layer), in which the indium concentration of the auxiliary layer is greater than the indium concentration of the light emitting layer in each quantum well having the auxiliary layer, so as to increase the carrier recombination rate, thereby enhancing the luminous intensity of the LED 200'.

To be specific, taking the quantum well having one pair of auxiliary layer 2341 and light emitting layer 2342 as example (shown in FIG. 4A), when there are k layers of quantum well 234 having the auxiliary layer 2341 in the active layer 230 of the LED 200', the enhancement effect of the luminous intensity is especially pronounced when a thickness of each quantum well 234 satisfies $10 \text{ Å} \leq T_1 + T_2 \leq 40 \text{ Å}$, namely, the sum of a thickness $T_1$ of the auxiliary layer 2341 and a thickness $T_2$ of the light emitting layer 2342 in each of the quantum wells is between 10 Å and 40 Å in the active layer. Alternatively, the luminous intensity is especially pronounced when the total thickness $kT_1$ of the k auxiliary layers 2341 and the total thickness $kT_2$ of the k light emitting layers 2342 satisfy $1 \leq kT_2/kT_1 \leq 7.04$.

On the other hand, due to the indium concentration of the auxiliary layer 2341 is greater than the indium concentration of the light emitting layer 2342 in each of the k quantum wells and the quantum barrier layer 232 having the highest energy gap is utilized to combine with the quantum well 234, the relationship among the lattice constants $a_1, a_2, a_3$ of the quantum barrier layer 232, the light emitting layer 2342 and the auxiliary layer 2341 is $a_1 < a_2 < a_3$. The enhancement effect of the luminous intensity is especially pronounced when the change rate between the lattice constants of the auxiliary layer 2341 and the light emitting layer 2342 in each of the quantum wells 234 satisfies $[(a_3-a_2)/a_2] \leq 13.4\%$. Furthermore, when there are k layers of quantum well 234 having the auxiliary layer 2341 in the active layer 230 of the LED 200, the change rate between the lattice constants of the auxiliary layer 2341 and the light emitting layer 2342 in each of the quantum wells 234 satisfies $4.4\% < [(a_3-a_2)/a_2] \leq 7.7\%$. Thus, the effects such as distributing more electrons and holes into the quantum wells, improving the localized effect, increasing the recombination of the carriers in the LED and enhancing the luminous intensity may be achieved. Other related details are illustrated in the afore-described descriptions depicted in FIG. 4A and FIG. 4B, so that the detailed description may be referred to the descriptions above, which is not repeated therein.

Furthermore, as described above, the effect of the defect density in the active region on the carriers can be lowered by intentionally doping n-type dopants through adjusting the layer number of the doped quantum barrier layers 232, varying the doping concentration of the n-type dopants (e.g. Si) in the quantum barrier layers 232, and the growth temperatures of the quantum barrier layers 232 in the active layer 230 (i.e., the growth temperatures of the quantum barrier layers 232 and the quantum wells 234 are the same), thereby further enhancing the luminous intensity of the LED 200' in the embodiment. The detailed description may be referred to the descriptions above, which is not repeated therein.

To sum up, in the LED according to the embodiments of the disclosure, by having k layers of quantum wells individually constituted by auxiliary layer and light emitting layer in the active layer, in which the indium concentration of the auxiliary layer is greater than an indium concentration of the light emitting layer, or by having k layers of quantum wells individually constituted by auxiliary layer and light emitting layer in the active layer, in which the lattice constants among the auxiliary layer, the light emitting layer and the quantum barrier layer satisfy specific relationships, or by forming a plurality of protuberances satisfying specific conditions on the N-face of the GaN substrate which may further cooperated with the afore-described active layer (that includes k quantum wells having the auxiliary layer), more self-assembled indium-riched regions are formed, together with the layer number of the doped quantum barrier layers being increased, the doping concentration of the n-type dopants in the quantum barrier layers being varied and the growth temperatures of the quantum barrier layers being equal to the quantum wells in the active layer, the n-type dopants compensate for the effect which defects of GaN have on the carriers, such that the carrier recombination rate of the LED can be enhanced, the thermal damages on the quantum wells can be avoided and the total reflection angle of the emitted light from the LED can be effectively adjusted to maintain a preferable power extraction. Accordingly, by employing any one of the afore-described techniques, the luminous intensity of the LED in the disclosure can be drastically increased at the 222 nm-405 nm and the 340 nm-405 nm wavelength ranges.

Figure 10:
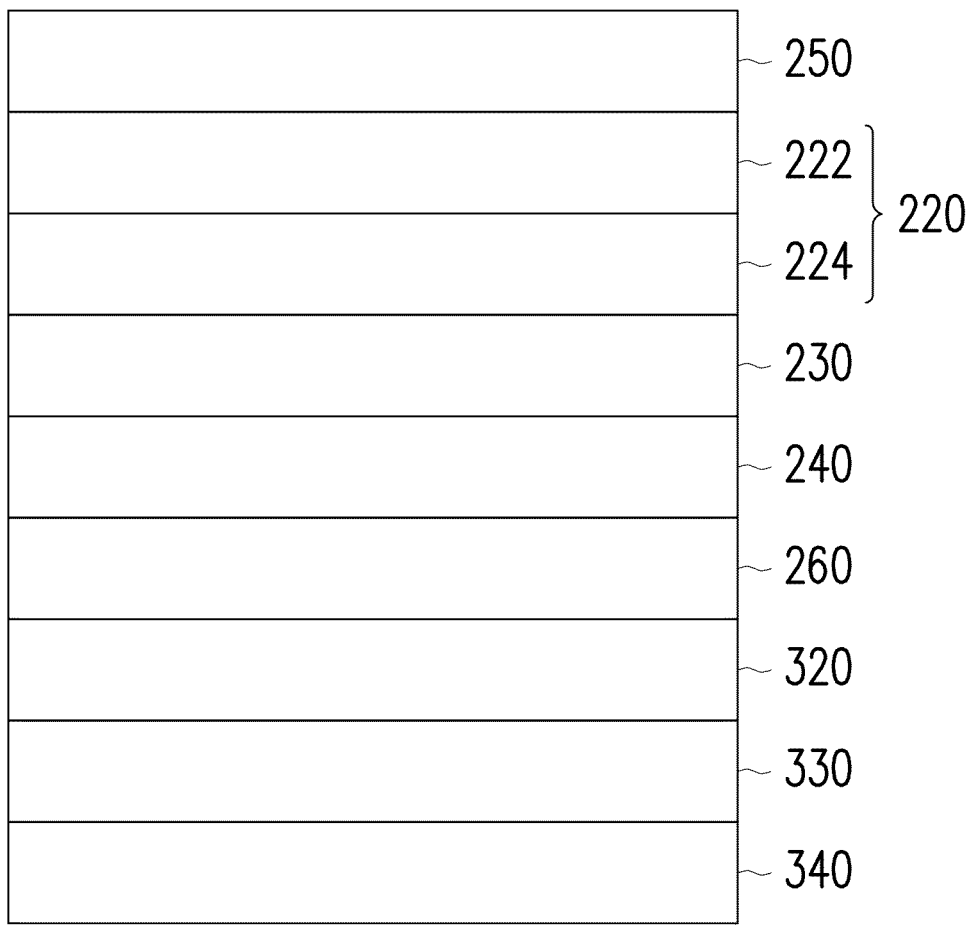
FIG. 10 is an implementation of an LED in the disclosure.
Figure 11:
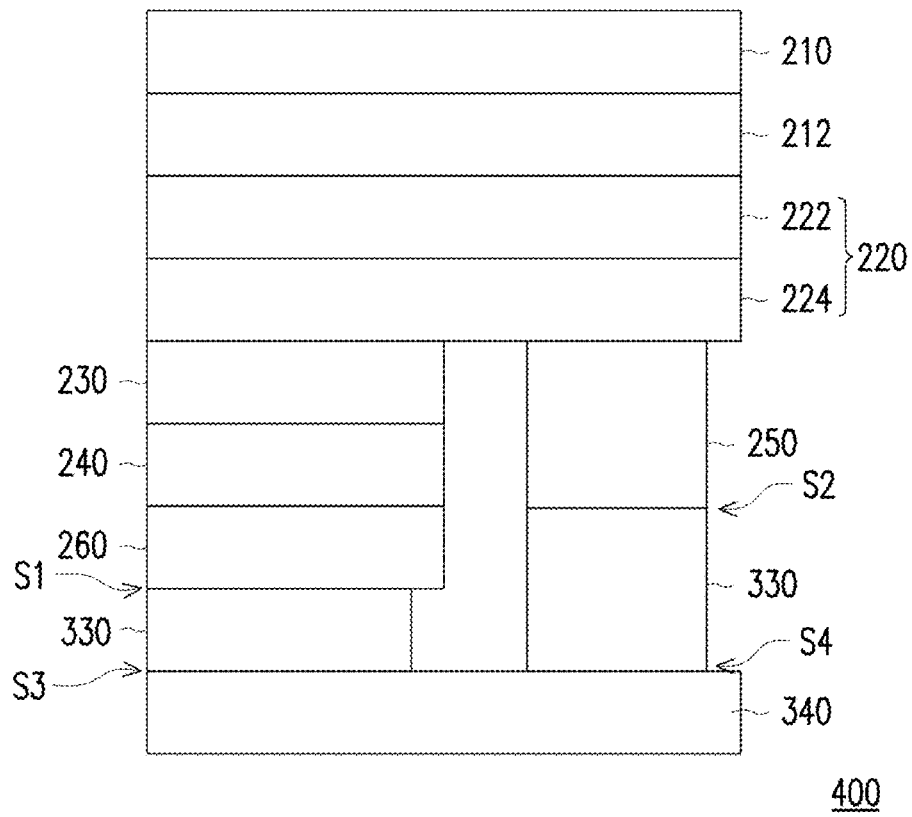
FIG. 11 is another implementation of an LED in the disclosure.
Figure 12:
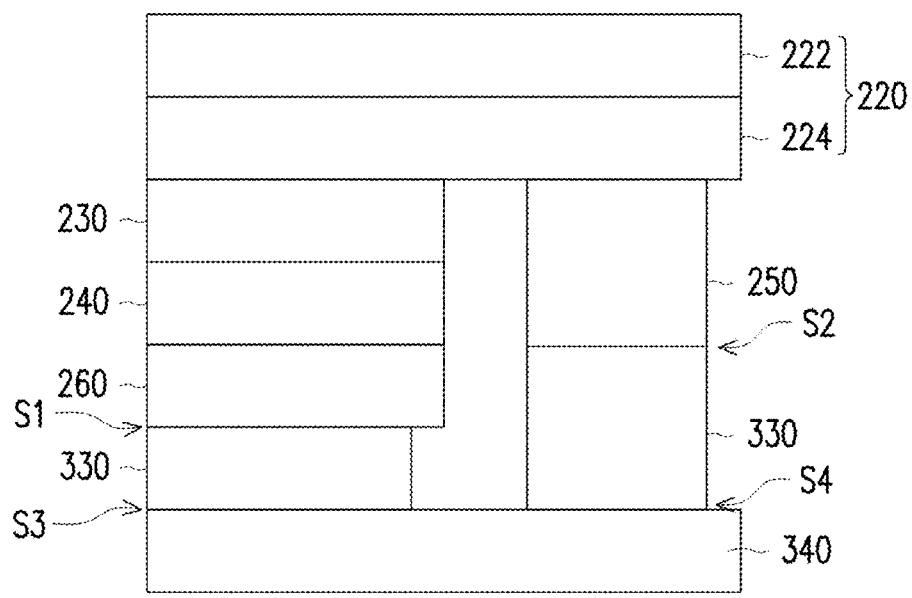
FIG. 12 is yet another implementation of an LED in the disclosure.

Moreover, the LED of the disclosure is not limited to the embodiments depicted above. The LED may be configured with horizontal electrodes or vertical electrodes, both of which can implement the disclosure but should not be construed as limiting the disclosure. For example, the structure of the LED in the disclosure may be implemented, as shown in FIG. 10 to FIG. 12, in which the active layer depicted in FIG. 10 through FIG. 12 can employ the afore-described active layer (that includes k quantum wells having the auxiliary layer). The detailed description may be referred to the descriptions above, which is not repeated therein. Furthermore, the same reference numbers are used in the drawings and the description to refer to the same or like parts, and so further elaboration is omitted.

FIG. 10 is an implementation of an LED in the disclosure. As shown in FIG. 10, the LED 300, from top to bottom, sequentially includes the first electrode 250, the n-type semiconductor layer 220 including the first n-type doped GaN layer 222 and the second n-type doped GaN layer 224, the active layer 230, the p-type semiconductor layer 240 and the second electrode 260 that are described above; a reflective layer 320; a bonding layer 330; and a carrier substrate 340. Moreover, in the actual applications, the LED 300 depicted in FIG. 10 is capable of being rotated 180 degrees as a whole, so that the carrier substrate 340 is located at the top of the LED 300 instead of being at the bottom to implement. The top-bottom relative positions illustrated here are an exemplary scope for implementation, although the disclosure is not limited thereto.

FIG. 11 is another implementation of an LED in the disclosure. As shown in FIG. 11, the LED 400, from top to bottom, sequentially includes the substrate 210, the nitride semiconductor capping layer 212, the n-type semiconductor layer 220 including the first n-type doped GaN layer 222 and the second n-type doped GaN layer 224, and the carrier substrate 340, in which two stacked layers are sandwiched between the n-type semiconductor layer 220 and the carrier substrate 340. As shown in FIG. 11, the first stacked layer comprises the active layer 230, the p-type semiconductor layer 240, the second electrode 260 and the first bonding layer 330, which is located on the left-hand side of FIG. 11. Furthermore, the second stacked layer is located on the right-hand side of the first stacked layer, and is separated away from the first stacked layer by a distance, in which the second stacked layer comprises the first electrode 250 and the second bonding layer 330. Moreover, according to the demand for the components, in the LED 400, a reflective layer may be disposed between the second electrode 260 and the first bonding layer 330 of the first stacked layer that is located on the left-hand side of the LED 400 (such as, an insert position S1 of the reflective layer shown in FIG. 11), or may be disposed between the first electrode 250 and the second bonding layer 330 of the second stacked layer that is located on the right-hand side of the LED 400 (such as, an insert position S2 of the reflective layer shown in FIG. 11), or the reflective layers may simultaneously exist at the afore-described insert positions (i.e., S1 and S2). In addition, the reflective layer may also be disposed between the carrier substrate 340 and the first bonding layer 330 of the first stacked layer that is located on the left-hand side of the LED 400 (such as, an insert position S3 of the reflective layer shown in FIG. 11), and between the carrier substrate 340 and the second bonding layer 330 of the second stacked layer that is located on the right-hand side of the LED 400 (such as, an insert position S4 of the reflective layer shown in FIG. 11). As such, the light emitted from the active layer 230 is capable of being reflected to a predetermined path via the reflective layer, although the disposition position of the reflective layer is not limited in the disclosure.

FIG. 12 is yet another implementation of an LED in the disclosure. As shown in FIG. 12, the layer structure of the LED 500 is similar to FIG. 11 except that the substrate 210 and the nitride semiconductor capping layer 212 located above the n-type semiconductor layer 220 are omitted in the LED 500 of FIG. 12, as compared with the LED 400 depicted in FIG. 11. Furthermore, the same reference numbers are used in the drawings and the description to refer to the same or like parts, and so further elaboration is omitted. Similarly, according to the demand for the components, in the LED 500, a reflective layer may be disposed between the second electrode 260 and the first bonding layer 330 of the first stacked layer that is located on the left-hand side of the LED 500 (such as, an insert position 51 of the reflective layer shown in FIG. 12), or may be disposed between the first electrode 250 and the second bonding layer 330 of the second stacked layer that is located on the right-hand side of the LED 500 (such as, an insert position S2 of the reflective layer shown in FIG. 12), or the reflective layers may simultaneously exist at the aforedescribed insert positions (i.e., S1 and S2). In addition, the reflective layer may also be disposed between the carrier substrate 340 and the first bonding layer 330 of the first stacked layer that is located on the left-hand side of the LED 500 (such as, an insert position S3 of the reflective layer shown in FIG. 12), and between the carrier substrate 340 and the second bonding layer 330 of the second stacked layer that is located on the right-hand side of the LED 500 (such as, an insert position S4 of the reflective layer shown in FIG. 12). As such, the light emitted from the active layer 230 is capable of being reflected to a predetermined path via the reflective layer.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode, comprising:
   a substrate;
   an n-type semiconductor layer and a p-type semiconductor layer, located on the substrate; and
   an active layer, located between the n-type semiconductor layer and the p-type semiconductor layer, wherein the active layer comprises i quantum wells and (i+1) quantum barrier layers, each of the quantum wells is located between any two of the quantum barrier layers, where i is a natural number greater than or equal to 1, each of k quantum wells among the i quantum wells is constituted of a light emitting layer and an auxiliary layer, wherein an indium concentration of the auxiliary layer is greater than an indium concentration of the light emitting layer, where k is a natural number greater than or equal to 1 and k≤i.

2. The light emitting diode as claimed in claim 1, further comprising:
   a first electrode and a second electrode, respectively located on the n-type semiconductor layer and the p-type semiconductor layer.

3. The light emitting diode as claimed in claim 1, wherein thicknesses of the auxiliary layer and the light emitting layer in each of the k quantum wells having the auxiliary layer are respectively $T_1$ and $T_2$, where 10 Å<$T_1+T_2$≤40 Å.

4. The light emitting diode as claimed in claim 1, wherein a total thickness $kT_1$ of the k auxiliary layers and a total thickness $kT_2$ of the k light emitting layers in the k quantum wells having the auxiliary layer satisfy the following relationship:

$$1 \leq kT_2/kT_1 \leq 7.04.$$

5. The light emitting diode as claimed in claim 1, wherein an $i^{th}$ quantum well of the i quantum wells closest to the n-type semiconductor layer comprises the light emitting layer, and a $k^{th}$ quantum well of the k quantum wells closest to the p-type semiconductor layer comprises of the light emitting layer and the auxiliary layer where the light emitting layer is disposed between the quantum barrier layer and the auxiliary layer.

6. The light emitting diode as claimed in claim 1, wherein growth temperatures of the quantum well and the quantum barrier layer are equal to each other.

7. The light emitting diode as claimed in claim 1, wherein a n-type dopant is doped in at least j layers of the (i+1) quantum barrier layers, j being a natural number greater than or equal to 1, j≤(i+1), and the doping concentration of the j quantum barrier layers is at least $2\times10^{18}/cm^3$.

8. A light emitting diode, comprising:
   a substrate;
   an n-type semiconductor layer and a p-type semiconductor layer, located on the substrate; and
   an active layer, located between the n-type semiconductor layer and the p-type semiconductor layer, wherein the active layer comprises i quantum wells and (i+1) quantum barrier layers, each of the quantum wells is located between any two of the quantum barrier layers, where i is a natural number greater than or equal to 1, each of k quantum wells among the i quantum wells is constituted of a light emitting layer and an auxiliary layer, wherein a lattice constant of the quantum barrier layer is $a_1$, a lattice constant of the light emitting layer is $a_2$ and a lattice constant of the auxiliary layer is $a_3$, $a_1 < a_2 < a_3$, where k is a natural number greater than or equal to 1 and k≤i.

9. The light emitting diode as claimed in claim 8, further comprising:
   a first electrode and a second electrode, respectively located on the n-type semiconductor layer and the p-type semiconductor layer.

10. The light emitting diode as claimed in claim 8, wherein the lattice constant $a_2$ of the light emitting layer and the lattice constant $a_3$ of the auxiliary layer satisfy the following relationship:

$$[(a_3-a_2)/a_2] \leq 13.4\%.$$

11. The light emitting diode as claimed in claim 8, wherein the lattice constant $a_2$ of the light emitting layer and the lattice constant $a_3$ of the auxiliary layer satisfy the following relationship:

$$4.4\% \leq [(a_3-a_2)/a_2] \leq 7.7\%.$$

12. The light emitting diode as claimed in claim 8, wherein an $i^{th}$ quantum well of the i quantum wells closest to the n-type semiconductor layer the light emitting layer, and a $k^{th}$ quantum well of the k quantum wells closest to the p-type semiconductor layer comprises of the light emitting layer and the auxiliary layer where the light emitting layer is disposed between the quantum barrier layer and the auxiliary layer.

13. The light emitting diode as claimed in claim 8, wherein growth temperatures of the quantum well and the quantum barrier layer are equal to each other.

14. The light emitting diode as claimed in claim 8, wherein a n-type dopant is doped in at least j layers of the (i+1) quantum barrier layers, j being a natural number greater than or equal to 1, j≤(i+1), and the doping concentration of the (i+1) quantum barrier layers is at least $2\times10^{18}/cm^3$.

15. A light emitting diode, comprising:
   a gallium nitride (GaN) substrate comprising a first surface and a second surface respectively disposed on two sides of the GaN substrate, the second surface has a plurality of protuberances, a height of the protuberances is h μm, and a distribution density of the protuberances on the second surface is d $cm^2$, where $h^2d \geq 9.87 \times 10^7$, and $h \leq 1.8$;

an n-type semiconductor layer, disposed on the first surface of the GaN substrate;

an active layer, disposed on the n-type semiconductor layer, and a wavelength of light emitted by the active layer is between 340 nm and 450 nm; and a p-type semiconductor layer, disposed on the active layer, wherein the active layer comprises i quantum wells and (i+1) quantum barrier layers, and each of the quantum wells is located between any two of the quantum barrier layers, where i is a natural number greater than or equal to 1, each of k quantum wells among the i quantum wells is constituted of a light emitting layer and an auxiliary layer, wherein an indium concentration of the auxiliary layer is greater than an indium concentration of the light emitting layer, where k is a natural number greater than or equal to 1 and k<i.

* * * * *